US011346619B2

(12) United States Patent
Li et al.

(10) Patent No.: US 11,346,619 B2
(45) Date of Patent: May 31, 2022

(54) MANUFACTURABLE METAL-GRAPHENE INTERFACE FOR HIGHLY EFFICIENT AND DURABLE CONDENSERS

(71) Applicant: UNIVERSITY OF SOUTH CAROLINA, Columbia, SC (US)

(72) Inventors: Chen Li, Chapin, SC (US); Wei Chang, Columbia, SC (US); Benli Peng, Columbia, SC (US)

(73) Assignee: University of South Carolina, Columbia, SC (US)

(*) Notice: Subject to any disclaimer, the term of this patent is extended or adjusted under 35 U.S.C. 154(b) by 0 days.

(21) Appl. No.: 16/217,100

(22) Filed: Dec. 12, 2018

(65) Prior Publication Data
US 2019/0186852 A1    Jun. 20, 2019

Related U.S. Application Data

(60) Provisional application No. 62/607,154, filed on Dec. 18, 2017.

(51) Int. Cl.
| F28F 21/00 | (2006.01) |
| F28F 21/02 | (2006.01) |
| C23C 16/26 | (2006.01) |
| F28F 21/08 | (2006.01) |

(52) U.S. Cl.
CPC ............. *F28F 21/02* (2013.01); *C23C 16/26* (2013.01); *F25B 2339/04* (2013.01); *F28F 21/089* (2013.01); *F28F 2245/04* (2013.01)

(58) Field of Classification Search
CPC ........ F28F 21/02; C23C 16/26; C01B 32/182; C01B 32/186
See application file for complete search history.

(56) References Cited

U.S. PATENT DOCUMENTS

| 3,289,754 A | 12/1966 | Erb et al. |
| 3,298,427 A | 1/1967 | Erb |
| 3,305,007 A | 2/1967 | Thelen et al. |
| 6,571,865 B1* | 6/2003 | Shi ............... C23C 14/0605 165/133 |

(Continued)

FOREIGN PATENT DOCUMENTS

| CN | 202630715 | 12/2012 |
| CN | 103359684 | 10/2013 |

(Continued)

OTHER PUBLICATIONS

Dahal, Graphene-nickel interfaces: a review, Nanoscale (Year: 2014).*

(Continued)

*Primary Examiner* — Eric S Ruppert
(74) *Attorney, Agent, or Firm* — Dority & Manning, P.A.

(57) ABSTRACT

The present disclosure relates to efficient condensing operations and apparatuses. Methods of fabricating condensers and specifically condenser surfaces are also disclosed. A condensing apparatus can include a condenser surface having a substrate and one or more layers of graphene. The substrate can be formed of nickel and a nickel-graphene surface composite layer can be formed. The substrate-graphene composite can be highly durable, hydrophobic, and resistant to fouling. Dropwise condensation can be induced.

12 Claims, 8 Drawing Sheets

(56) References Cited

U.S. PATENT DOCUMENTS

| | | | |
|---|---|---|---|
| 9,322,096 | B2 | 4/2016 | Yager et al. |
| 9,689,071 | B2 * | 6/2017 | Hwang .................. C21D 1/72 |
| 2011/0220237 | A1 * | 9/2011 | Okamoto ............... F16L 13/08 |
| | | | 138/140 |
| 2014/0263081 | A1 | 9/2014 | Thiers |
| 2014/0272195 | A1 | 9/2014 | McAlister |
| 2015/0064451 | A1 * | 3/2015 | Kalaga .................... B05D 1/28 |
| | | | 428/336 |
| 2015/0368535 | A1 | 12/2015 | Dardona et al. |
| 2017/0043373 | A1 | 2/2017 | Paxson et al. |
| 2018/0216230 | A1 | 8/2018 | Wald et al. |
| 2018/0346338 | A1 | 12/2018 | Cho et al. |

FOREIGN PATENT DOCUMENTS

| | | | | |
|---|---|---|---|---|
| CN | 103510132 | | 1/2014 | |
| CN | 104773726 | | 7/2015 | |
| CN | 105239061 | | 1/2016 | |
| CN | 106835066 | | 6/2017 | |
| EP | 2845919 | A1 * | 3/2015 | ........... F25D 23/065 |
| IN | 141837 | | 4/1977 | |
| KR | 2015-0146264 | A | 12/2015 | |
| KR | 20150146264 | A * | 12/2015 | |

OTHER PUBLICATIONS

Pe, et al., Graphene grown on stainless steel as a high-performance and ecofriendly anti-corrosion coating for polymer electrolyte membrane fuel cell bipolar plates, Journal of Power Sources (Year: 2015).*

Hansen, et al. "Improving Condenser Efficiency with Innovative Scale Removal System Technology" *Proc. ASME Power* (2004) pp. 1-5.

Bae, et al. "Roll-to-roll production of 30-inch graphene films for transparent electrodes" *Nature Nanotechnology* 5(8) (2010) pp. 574-578.

Boinovich, et al. "Hydrophobic materials and coatings: principles of design, properties and applications" *Russian Chemical Reviews* 77(7) (2008) pp. 583-600.

Dahal, et al. "Graphene-nickel interfaces: a review" *Nanoscale* 6(5) (2014) pp. 2548-2562.

Emelyanenko, et al. "On the effect of discrete charges adsorbed at the interface on nonionic liquid film stability: charges in the film" *J. Phys.: Condens. Matter* 20:494227 (2008) pp. 1-6.

Enright, et al. "Dropwise Condensation on Micro- and Nanostructured Surfaces" *Nanoscale and Microscale Thermophysical Engineering* 18(3) (2014) pp. 223-250.

Hsieh, et al. "Complete Corrosion Inhibition through Graphene Defect Passivation" *ACS Nano* 8(1) (2014) 443-448.

Kirkland, et al. "Exploring graphene as a corrosion protection barrier" *Corrosion Science* 56 (2012) pp. 1-4.

Paxson, et al. "Stable Dropwise Condensation for Enhancing Heat Transfer via the Initiated Chemical Vapor Deposition (iCVD) of Grafted Polymer Films" *Advanced Materials* 26(3) (2014) pp. 418-423.

Polsen, et al. "High-speed roll-to-roll manufacturing of graphene using a concentric tube CVD reactor"*Sci. Rep.* 5:10257 (2015) pp. 1-12.

Preston, et al. "Scalable Graphene Coatings for Enhanced Condensation Heat Transfer" *Nano Lett*, 15(5) (2015) pp. 2902-2909.

Rose, J. "Dropwise condensation theory and experiment: a review" *Proc. Inst. Mech. Eng. Part A—J. Power Energy* 216(A2) (2002) pp. 115-128.

Schriver, et al. "Graphene as a Long-Term Metal Oxidation Barrier: Worse Than Nothing" *ACS Nano* 7(7) (2013) pp. 5763-5768.

Yoon, et al. "Negative thermal Expansion Coefficient of Graphene Measured by Raman Spectroscopy" *Nano Lett.* 11(8) (2011) pp. 3227-3231.

Bhaviripudi, et al. "Role of kinetic factors in chemical vapor deposition synthesis of uniform large area graphene using copper catalyst" *Nano Lett.* 10 (2010) pp. 4128-4133.

Celebi, K. "Chemical Vapor Deposition of Graphene on Copper" *ETH Zurich* (2013) pp. 1-124.

International Search Authority. "International Search Report & Written Opinion" PCT/US2020/050688 (Dec. 30, 2020) pp. 1-10.

* cited by examiner

MANUFACTURABLE METAL-GRAPHENE INTERFACE FOR HIGHLY EFFICIENT AND DURABLE CONDENSERS

PRIORITY INFORMATION

The present application claims priority to U.S. Provisional Patent Application Ser. No. 62/607,154 titled "MANUFACTURABLE METAL-GRAPHENE INTERFACE FOR HIGHLY EFFICIENT AND DURABLE CONDENSERS," filed on Dec. 18, 2017, the entire disclosure of which is incorporated by reference herein.

GOVERNMENT SUPPORT

The subject invention was made with government support under a research project supported by the National Science Foundation Grant Number 1357920. The government has certain rights in the invention.

BACKGROUND

Condensers are important to many industries. For example, condensers are widely used in the petrochemical industry, but also for water purification, desalination, and power generation. In power generation, steam is made from heat generated by fossil fuels or other sources. The steam generation creates high pressures and the steam flows through a turbine to a lower pressure area and eventually collects as water on a condenser. The condenser therefore creates a low pressure environment by removing steam from the system and producing water. Unfortunately, according to some estimates, condenser inefficiencies result in 50% or more wasted energy.

Condenser inefficiency can occur for a variety of reasons, but regardless of the cause, the problem is inefficient heat transfer across the condensing elements. One cause of inefficiency is simply the buildup of a layer of water on the surface of the condenser, which acts as an insulating element. This phenomenon is what is known as film-wise condensation (FWC), wherein a film of water remains on the surface of the condenser and acts as an insulator. This insulating blanket of water slows heat transfer from the coolant side to the steam condensing side. The prior art has attempted to mitigate this problem by adopting dropwise condensation (DWC) using hydrophobic surfaces. In dropwise condensation, drops of water form on the condenser surface and are quickly carried away under their own weight or by another mechanism. This avoids the formation of the film of water that acts as an insulator. However, hydrophobic materials tend to be poor heat conductors and the efficiency gains made by adopting hydrophobic materials are negated by their reduced heat transfer ability.

Other attempts to adopt dropwise condensation include applying thin layers of hydrophobic materials such as polymer coatings on condenser surfaces. However, most coatings have a tendency to deteriorate quickly as they are not well suited for long-term operation in corrosive environments with high temperatures and steam. Scale buildup and biofouling have also proven to be a significant source of condenser inefficiencies. The scale and biofilms formed on the surface of the condenser can also act as an insulating layer that prevents heat transfer. Condenser biofouling and scale buildup may be especially prevalent in water desalination and purification. To prevent biofouling and scale buildup, chemical treatment such as chlorination is often used. Of course, biofouling, scale buildup, and even the chemical treatment used to prevent these issues are detrimental to thin hydrophobic condenser coatings and further complicate the goal of achieving efficient heat transfer and dropwise condensation.

In summary, condenser efficiency is an important objective for both industrial and domestic applications. The seemingly simplistic nature of condenser function is deceiving as improving condenser efficiency in practice is a complicated problem that presents multiple different challenges. Accordingly, the art is in need of new technologies for increasing condenser efficiency, increasing condenser durability, and promoting dropwise condensation.

BRIEF SUMMARY

The present disclosure relates to efficient condensing operations and apparatuses. Methods of fabricating condensers and specifically condenser surfaces are also disclosed. According to an embodiment, layers of graphene are applied to the surface of a condenser. The graphene can act as a robust coating or integrated composite material on the surface of the condenser.

An embodiment includes a condenser having a coolant side and a condensing side. A substrate to receive the graphene can be formed on the coolant side, the condensing side, or both the condensing side and the coolant side. The graphene can be applied to the substrate in a single layer or in multiple layers. The substrate can be a metal substrate made of materials such as nickel, nickel alloys, copper, or copper alloys.

The base or structural component of the condenser can be made of the same material as the substrate or can be an altogether different material. For example, the base of the condenser can be made of stainless steel or titanium tubing and a nickel substrate can be applied over the condenser base. The substrate for receiving the graphene layers as well as the graphene layers themselves can be located on the coolant side, the condensing side, or both the condensing side and coolant side of the heat exchanging portion of the condenser.

The graphene layers may be viewed as a coating, but may be better described as an integrated composite material with the substrate. Specifically, π-orbitals of the graphene can hybridize with the d-electrons of the substrate. This electron hybridization can be particularly effective with nickel and nickel alloys and can result in robust surface properties that are resistant to corrosion, biofouling, and chemical attack. Furthermore, the graphene-functionalized substrate can maintain a hydrophobic surface and allow for efficient dropwise condensation.

The thermal expansion mismatch between the substrate and the graphene can be minimized to prevent the graphene layers from detaching from the substrate surface. In some embodiments, the thermal mismatch is less than $25 \times 10^{-6}$ k$^{-1}$, and, in some embodiments can be less than $18 \times 10^{-6}$ k$^{-1}$. Graphene can be applied to the substrate in various ways. For example, graphene can be applied to the substrate using chemical vapor deposition (CVD), thin film physical vapor deposition (PVD) such as direct current magnetron sputtering, or deposition of hydrogenated amorphous carbon. In one particular embodiment, the graphene can be applied via atmospheric pressure chemical vapor deposition (APCVD).

The graphene layer can have a thickness from 1.0 nm to 100 nm, or greater. The base of the condenser can be fabricated from brass, copper, nickel, aluminum, stainless steel, carbon steel, or a mixture or alloy of any of the previous compositions. The base (i.e., the structural component) of the condenser can serve as the substrate or a separate substrate layer can be applied on top of the condenser base. Graphene can then be applied to the substrate to form an integrated substrate-graphene composite surface.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which.

Repeat use of reference characters in the present specification and drawings is intended to represent the same or analogous features or elements of the present invention.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

The present disclosure relates to efficient and robust condensing operations, apparatuses, and fabrication methods thereof. Condensers play an important role in many industries including petrochemicals, automotive, heating ventilation and air conditioning (HVAC), power generation, and water purification and desalination. Unfortunately, designing efficient condensers that can withstand varying environments is a difficult challenge. Problems and inefficiencies associated with the surface of condensers include biofouling (e.g., biofilms and bacteria on the condenser surface), oxidation of the condenser surface, and the films of water themselves acting as insulators. Also, when steam or water condenses, dissolved non-condensable gasses such as oxygen can oxidize and otherwise degrade the condenser surface. The methods and apparatuses discussed herein seek to mitigate or eliminate these problems of the prior art.

Figure 1:
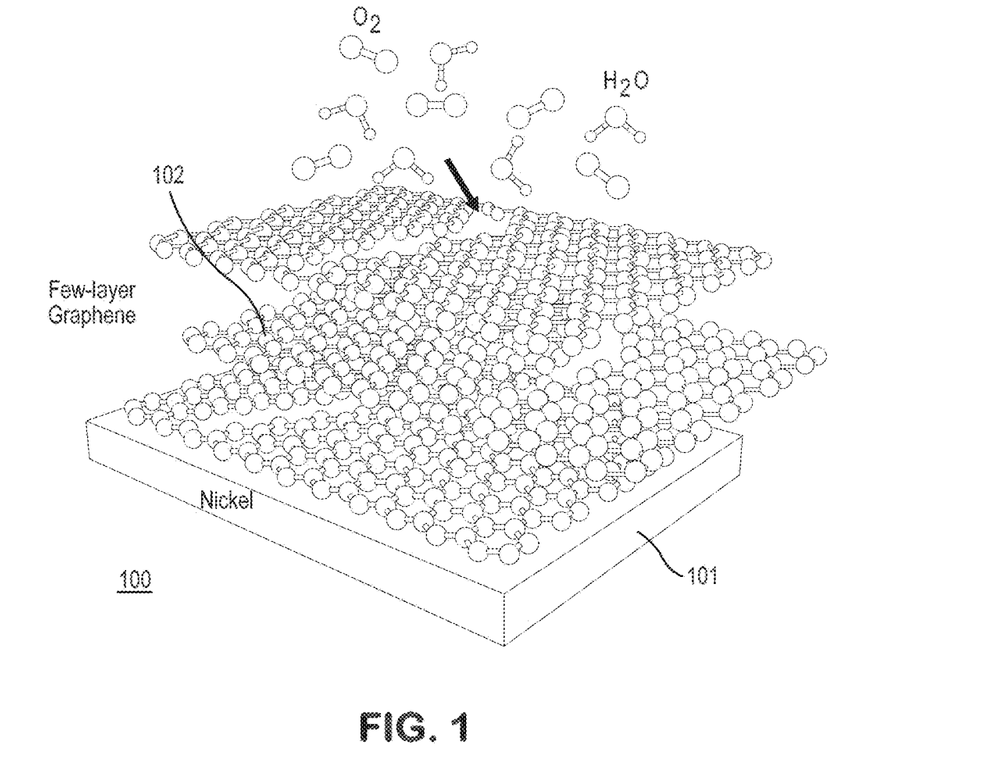
FIG. 1 shows a nickel-graphene interface according to an embodiment of the present invention.

Methods of fabricating condensers, and specifically condenser surfaces, are also disclosed. FIG. 1 shows a condenser surface 100 according to an embodiment of the present invention. The condenser surface includes of a substrate 101 and one or more layers of graphene 102. One, two, three, or more layers of graphene 102 can be formed on the substrate. The graphene can be formed as a layer on the substrate, but may preferably be formed in a manner that results in the creation of a substrate-graphene composite in which the graphene is integrated with the substrate material. That is, the molecular structure of the graphene can interact and even embed itself within the molecular structure or crystal lattice of substrate. Specifically, π-orbitals of the graphene can hybridize with the d-electrons of the substrate. The unique nature of the nickel-graphene composite allows for especially strong bonding. For example, the separation between the graphene and the substrate can be from about 0.05 nm to about 0.5 nm, preferably from about 0.1 nm to about 0.3 nm, and even more preferably from about 0.15 nm to about 0.25 nm. In a specific example, the separation between the respective materials in nickel-graphene composites is approximately 0.21 nm.

The substrate 101 can be formed of any material that is conventionally known in the art including stainless steel, copper, brass, nickel, aluminum, titanium, as well as mixtures and alloys thereof. In some embodiments, the thermal mismatch between the graphene layers and the substrate can be less than $25 \times 10^{-6}$ k⁻1, such as less than $20 \times 10^{-6}$ k$^{-1}$, such as less than $18 \times 10^{-6}$K⁻1, such as less than $15 \times 10^{-6}$ k$^{-1}$. The thermal mismatch can also range from about $25 \times 10^{-6}$ k⁻1 to about $8 \times 10^{-6}$ k$^{-1}$, such as from about $19 \times 10^{-6}$ k⁻1 to about $11 \times 10^{-6}$ k$^{-1}$, such as from about $16 \times 10^{-6}$ k⁻1 to about $12 \times 10^{-6}$ k$^{-1}$.

In a specific embodiment, the substrate 101 can be a nickel or nickel alloy. Nickel and nickel alloys have been found to work particularly well with graphene, and it is believed that the graphene embeds itself within or binds tightly with the crystal lattice of the nickel substrate. The condenser can also be formed of a base material (such as stainless steel, copper, brass, aluminum, titanium, as well as mixtures and alloys thereof) that acts as the structural support of the condenser with a thin layer of nickel or nickel-alloy present on the surface of the base material. The thin layer of nickel or nickel-alloy on the surface of the base material can be applied using, for example, electroplating techniques. The nickel or nickel-alloy coating can therefore have a thickness of from about 1 to about 100 micrometers, such as from about 20 to about 80 micrometers, such as from about 40 to about 60 micrometers.

Figure 2:
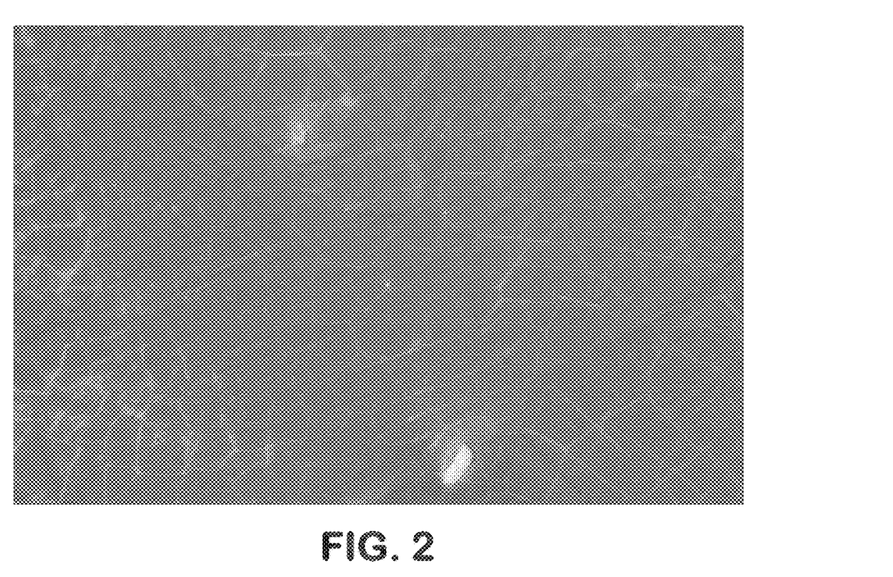
FIG. 2 shows a scanning electron microscope image of graphene layers on a nickel substrate.

FIG. 2 shows a scanning electron microscope image of graphene layers on a nickel substrate. The image shows a relatively uniform and defect free graphene structure. The graphene grain sizes should optimally be large and defect-free and can have an average diameter or width of greater than about 3 micrometers, such as greater than about 5 micrometers, such as greater than about 10 micrometers, such as greater than about 20 micrometers. Furthermore, the graphene grain sizes (or diameter, or width) can range from about 1 micrometer to about 50 micrometers, such as from about 3 micrometers to about 30 micrometers, such as from about 10 micrometers to about 20 micrometers.

Figure 3:
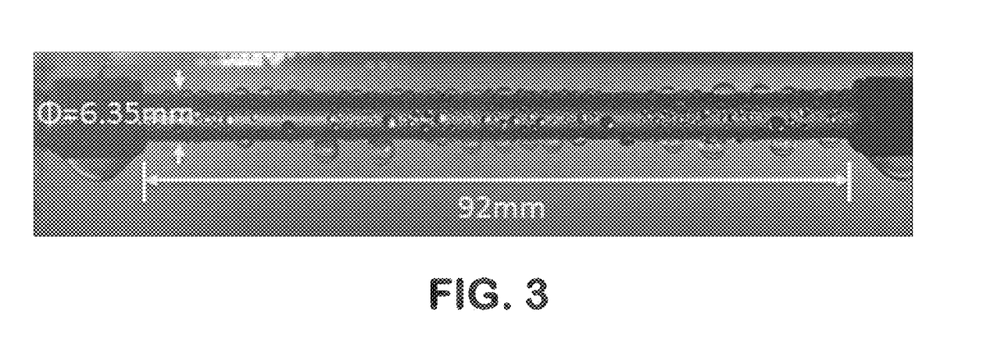
FIG. 3 shows dropwise condensation occurring on a tube with a nickel-graphene surface.

FIG. 3 shows a tube condenser having a nickel-graphene composite surface in accordance with an embodiment of the present disclosure. The tube condenser of FIG. 3 has coolant running within the tube and steam condensing on the surface of the tube. Dropwise condensation is achieved on the surface of the tube. The dropwise condensation wipes away water films from the surface of the tube and keeps water films from forming an insulating layer that would reduce the heat transfer of the condenser. The dropwise condensation is achievable due to the hydrophobic nature of the nickel-graphene composite surface. The hydrophobic surface may be attributable to weak van der Waals forces between the graphene layers and the out-of-plane water droplets. This may result in reduced drag forces between the substrate-graphene surface and the water droplets and further promote dropwise condensation.

The substrate-graphene surface can be applied to any conventional condenser material which acts as a structural base and provides structural integrity. For example, the base of the condenser can be made of conventional materials that are known in the art such as stainless steel, carbon steel, titanium, aluminum, copper, nickel, brass, and mixtures and alloys therefore. The base can form the structural support for condenser tubing and fins that promote heat transfer. The substrate can then be applied to the condenser base followed by the layers of graphene. Alternatively, the condenser base can serve directly as the substrate.

Figure 8:
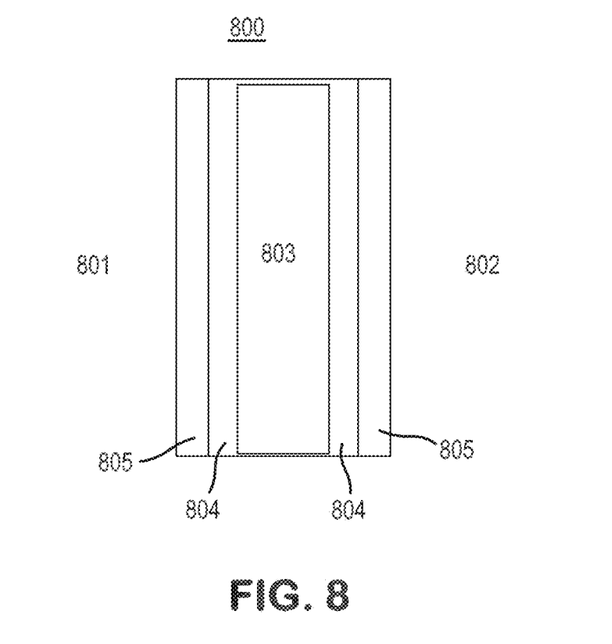
FIG. 8 shows a heat exchanger wall having substrate-graphene interfaces on both a coolant side and a condenser side.

FIG. 8 shows a heat exchanger wall 800 having substrate-graphene interfaces on both a coolant side 801 and a condenser side 802. The heater exchanger wall 800 can have a base material 803 that serves as a structural support. A substrate layer 804 can be formed on one or both sides of the heat exchanger wall 800. One or more layers of graphene 805 can be applied to the substrates 804, or a suitable base material 803 can directly serve as the substrate.

Graphene can be applied to the substrate in various ways. For example, graphene can be applied to the substrate using chemical vapor deposition (CVD), atmospheric pressure CVD, thin film physical vapor deposition (PVD) such as direct current magnetron sputtering, and deposition of hydrogenated amorphous carbon. The graphene layer can have a thickness greater than about 5 nm, such as greater than about 10 nm, such as greater than about 20 nm, such as greater than about 30 nm. The graphene layer's thickness can also range from about 2 nm to about 100 nm, such as from about 5 nm to about 50 nm, such as from about 10 nm to about 30 nm.

Graphene composite interfaces of the present disclosure can reduce biofouling by reducing bacterial adhesion by 50% or more. Calcium sulfate and other scale deposition rates can also be reduced. Furthermore, low surface energy graphene interfaces can be easily cleaned to remove scale and biofouling agents as their contact adhesion force is lessened by the graphene composite surface.

The present invention may be better understood with reference to the following examples.

Example 1

Figure 4A:
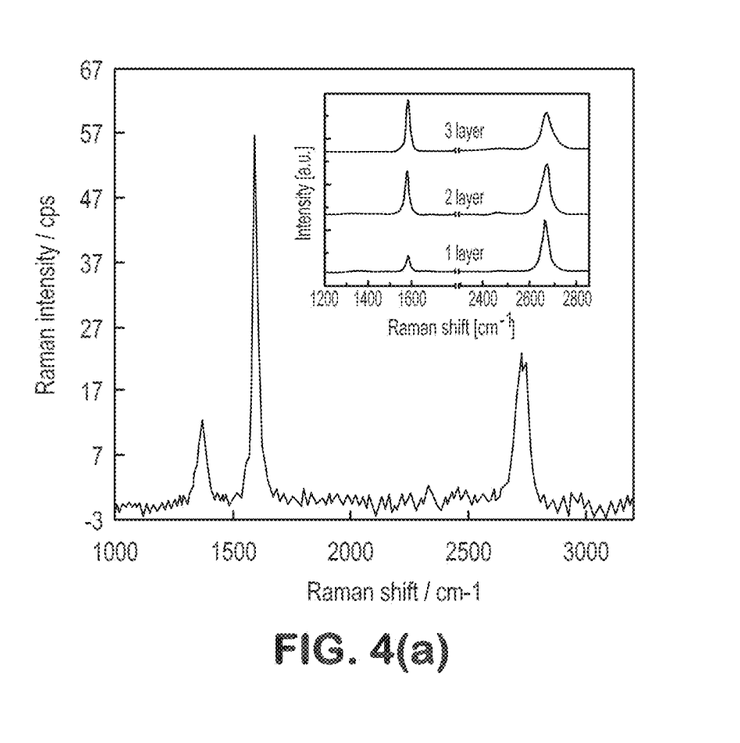
FIG. 4(a) shows a Raman spectroscopy graph for multiple layers of graphene on a nickel tube.
Figure 4B:
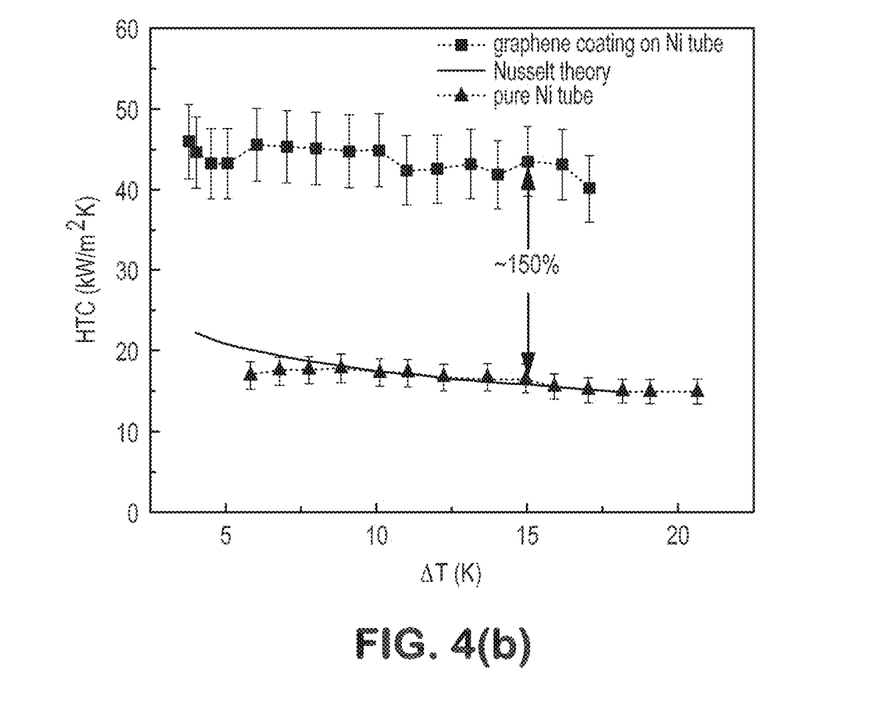
FIG. 4(b) shows heat transfer coefficients (HTCs) of a pure nickel tube and a nickel tube having graphene layers according to an embodiment.
Figure 4C:
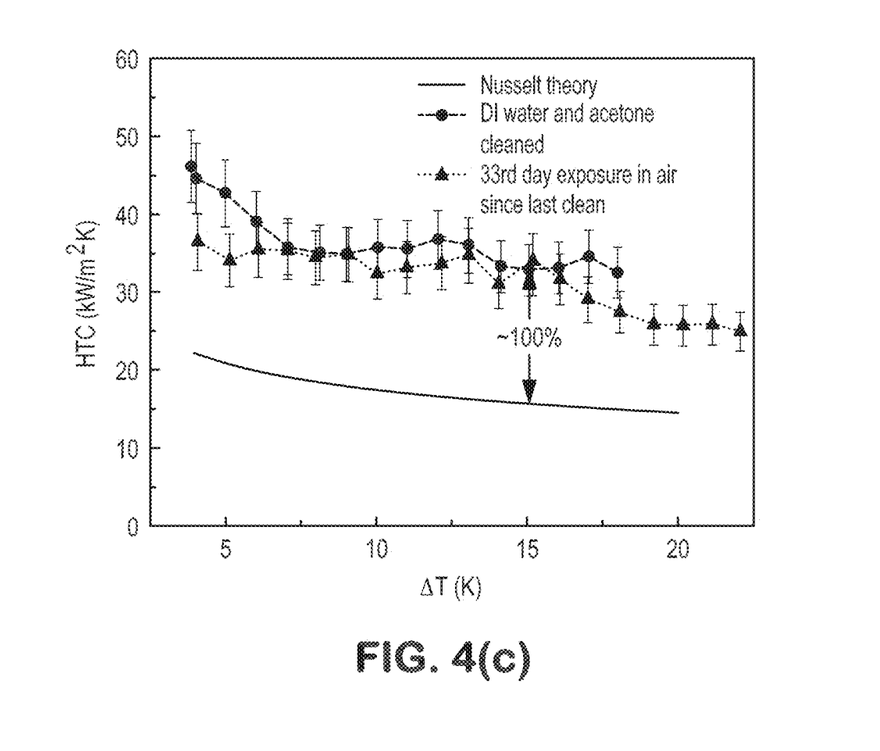
FIG. 4(c) shows HTCs after a period of 33 days.

Nickel-graphene composite surfaces were produced. FIG. 4(a) shows a Raman spectroscopy graph for one, two, and three layers of graphene on a nickel substrate. FIG. 4(b) shows heat transfer coefficients (HTCs) of a pure nickel tube and a nickel tube having graphene layers. It can be seen that the nickel-graphene surface is able to produce approximately 150% greater heat transfer than the nickel tube without graphene. FIG. 4(c) shows HTCs after a period of 33 days. It shows that the nickel-graphene composite surface maintained superior heat transfer over the nickel only surface.

Example 2

Figure 5A:
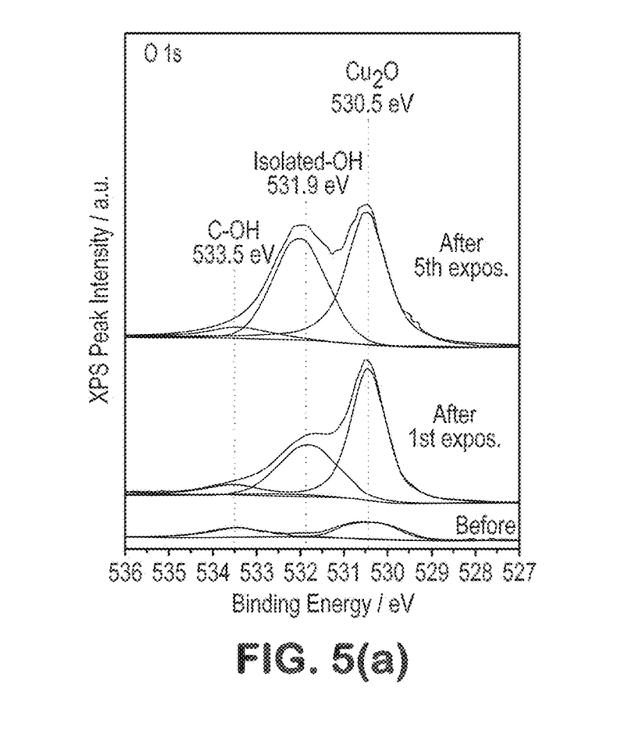
FIG. 5(a) shows an X-ray photoelectron spectroscopy (XPS) graph of the peak intensity of a copper-graphene interface after a two hour test.
Figure 5B:
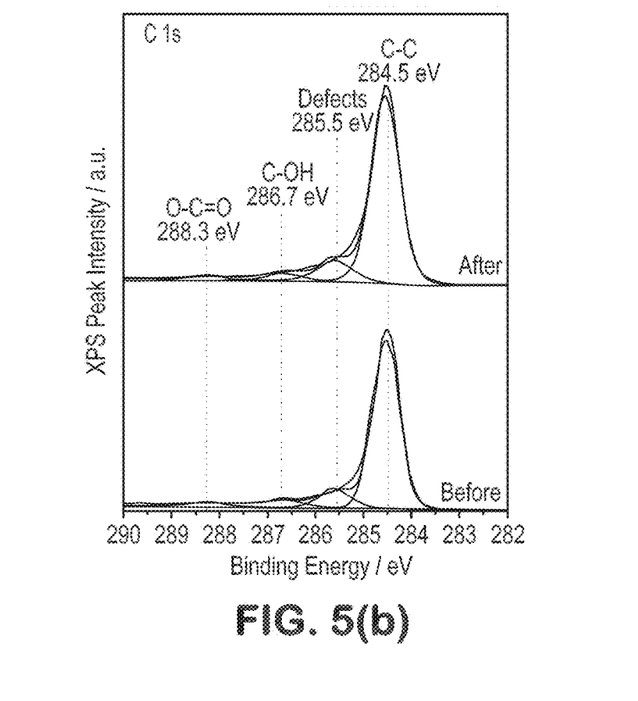
FIGS. 5(b), 5(c), and 5(d) show the peak intensity of nickel-graphene interfaces after a one-month test.
Figure 5C:
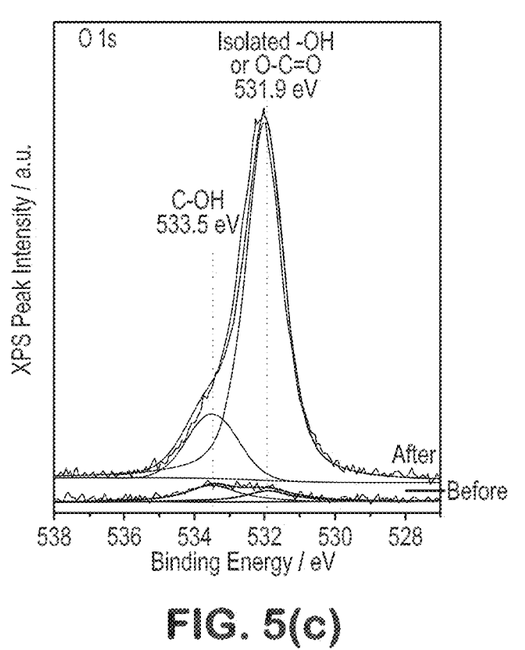
Figure 5D:
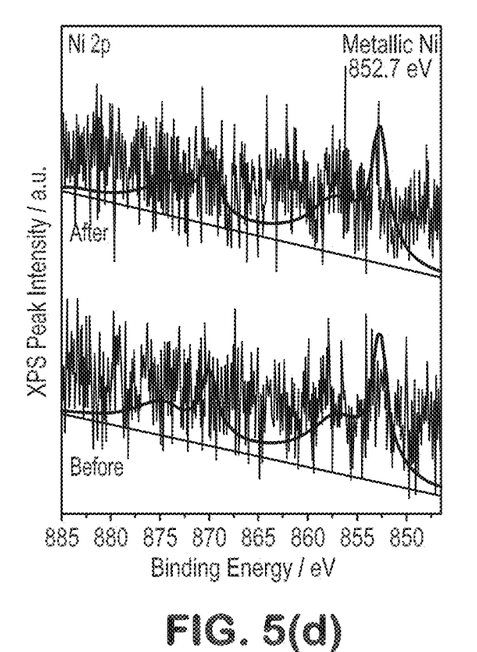

Both copper-graphene-monolayer and nickel-graphene-multilayer interfaces were prepared for steam condensation testing. Both surfaces were examined by X-ray photoelectron spectroscopy (XPS) before and after condensation experiments. As illustrated by FIG. 5(a), copper-graphene was oxidized after one two-hour test and quickly lost its graphene enhancement. In contrast, after a month-long test in air, the nickel-graphene composite did not show much oxidation, as seen in FIGS. 5(b), 5(c), and 5(d). The slight degradation in HTCs is likely due to the accumulation of hydroxyl groups (FIG. 5(b)), which increased with test time (FIG. 5(c)). This study shows that nickel-graphene interfaces exhibit superior anticorrosion properties in harsh steam environments. The superior durability of the nickel-graphene interface could be due to the similarities in thermal expansion between nickel and graphene. The thermal expansion mismatch between the graphene monolayer and the copper substrate is on the order of $19.2 \times 10^{-6} K^{-1}$, causing the graphene to separate from the copper substrate. However, the nickel-graphene interface has a smaller thermal expansion mismatch, on the order of $14 \times 10^{-6} K^{-1}$. Considering the additional lubrication effect between graphene layers, the nickel-graphene interface showed far better thermal expansion mismatch and durability.

Figure 6A:
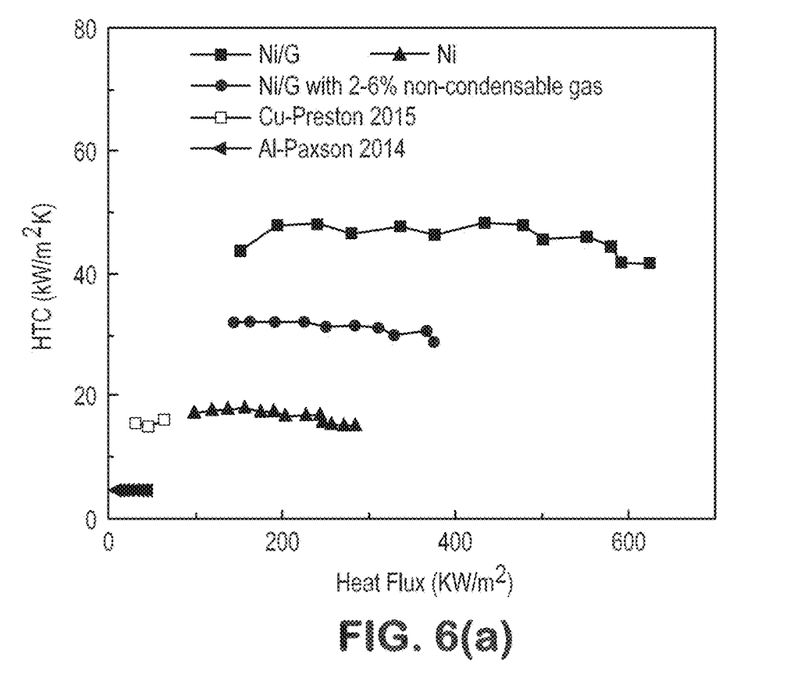
FIGS. 6(a), 6(b), and 6(c) show efficient dropwise condensation (DWC) and heat transfer coefficients of nickel-graphene surfaces.
Figure 6B:
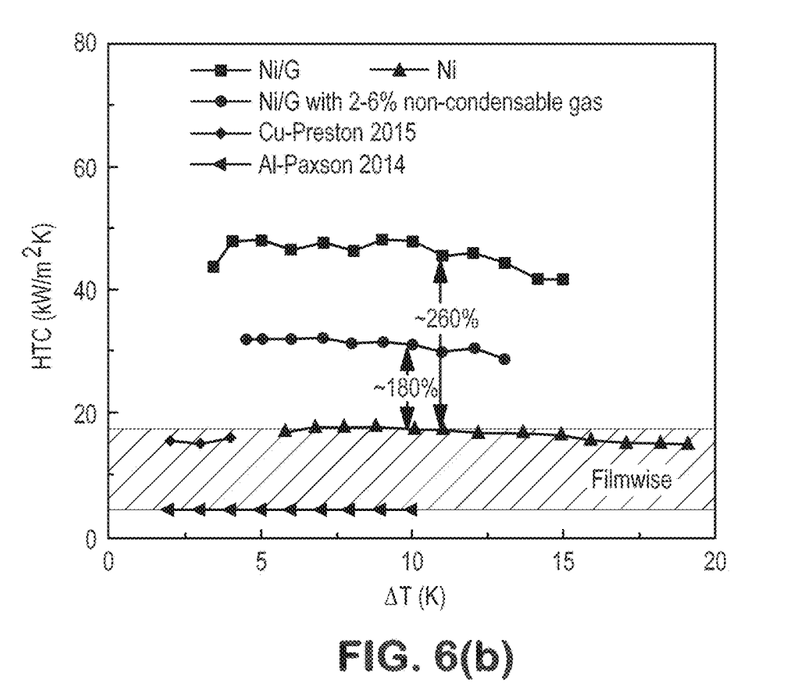
Figure 6C:
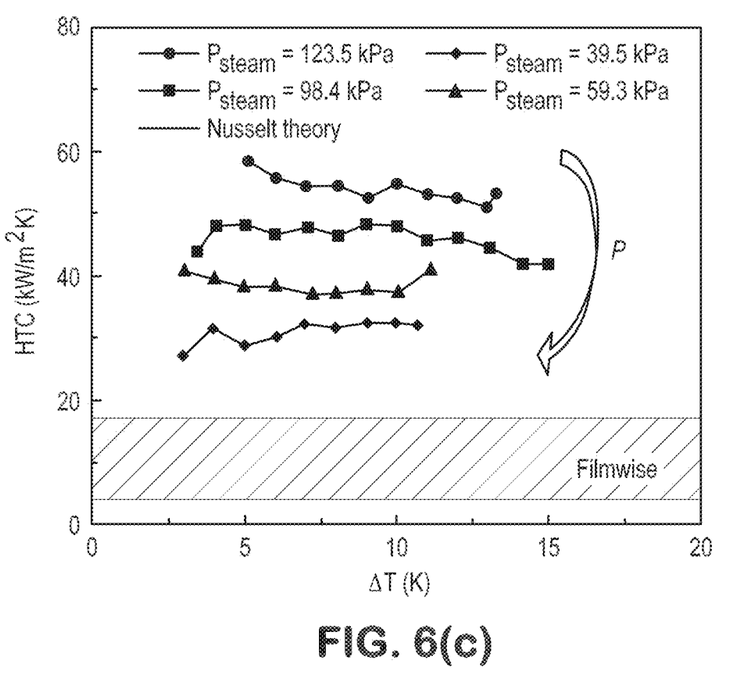

FIGS. 6(a), 6(b), and 6(c) show efficient dropwise condensation (DWC) and heat transfer coefficients of nickel-graphene surfaces. As illustrated in FIG. 6(a), nickel-graphene interfaces can enable up to six-times greater heat flux compared to other condenser surfaces. FIG. 6(b) shows equally important that, even with a high percentage of air, an approximately 180% enhancement is still achieved by a nickel-graphene interface relative to the state-of-practice film-wise condensation. Heat transfer coefficients generally decrease with lower working pressure, but the nickel-graphene interfaces still showed significant enhancement of approximately 200% at 0.4 atmospheres of pressure and at a subcooled temperature of 10° C. FIG. 6(c) shows heat transfer coefficients with different steam pressures. FIG. 6(c) demonstrates that higher steam pressures produce greater heat transfer coefficients. However, all of the heat transfer coefficients demonstrated are greater than the filmwise heat transfer coefficients, as shown in the shaded lower portion.

Example 3

Figure 7A:
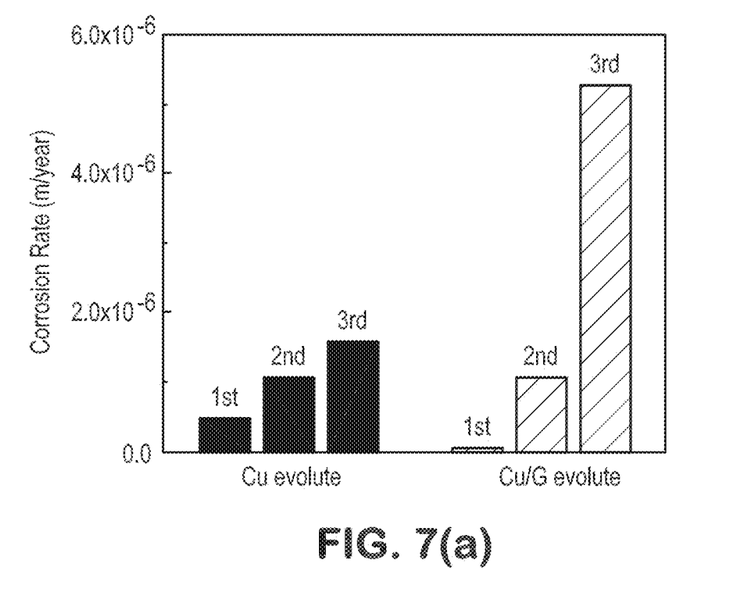
FIG. 7(a) shows the corrosion rate of copper-graphene interfaces and FIG. 7(b) shows the corrosion rate of nickel-graphene interfaces.
Figure 7B:
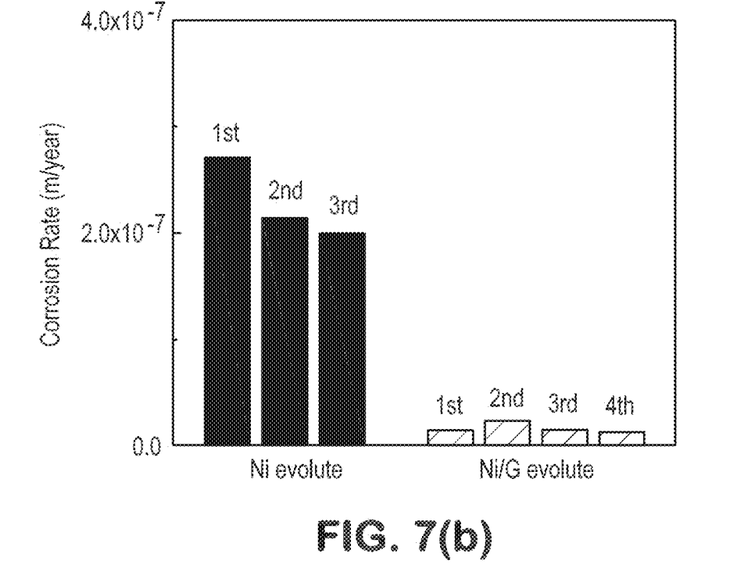

Corrosion studies were performed using Tafel analysis. FIG. 7(a) shows the corrosion rates of copper-graphene interfaces and FIG. 7(b) shows the corrosion rates of nickel-graphene interfaces. As illustrated in FIG. 7(a), copper-graphene initially shows a low corrosion rate. However, once corrosion starts to occur locally, the corrosion rate begins to accelerate rapidly and globally. In contrast and as illustrated in FIG. 7(b), the nickel-graphene interface is extremely stable and showed an approximately 450× lower corrosion rate even after a fourth test.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed is:

1. A condensing apparatus comprising:
a condenser having a coolant side and a condensing side;
a substrate on the coolant side or the condensing side or both, the substrate comprising brass, copper, a copper alloy, nickel, a nickel alloy, or a combination thereof at a surface;
a continuous electroplated layer of pure nickel or nickel alloy having a thickness of from about 1 micrometer to about 100 micrometers on the surface of the substrate;
one or more layers of graphene on a surface of the continuous electroplated layer of pure nickel or nickel alloy; and
a nickel graphene composite interface comprising π-orbitals of the graphene hybridized with d-electrons of nickel of the pure nickel or nickel alloy.

2. The apparatus of claim 1, wherein three or more layers of graphene are on the surface of the substrate.

3. The apparatus of claim 1, wherein the one or more layers of graphene are on the condensing side of the condenser providing hydrophobicity.

4. The apparatus of claim 1, wherein a thermal expansion mismatch between the substrate and the graphene is less than $18 \times 10^{-6}$ $k^{-1}$.

5. The apparatus of claim 1, wherein the electroplated layer comprises pure nickel.

6. The condensing apparatus of claim 1, wherein the one or more layers of graphene have a grain size greater than about 3 micrometers.

7. A condensing apparatus fabrication method comprising:
electroplating a continuous layer of pure nickel or nickel alloy on a surface of a condensing element, the surface comprising brass, copper, a copper alloy, nickel, a nickel alloy, or a combination thereof, the continuous electroplated layer having a thickness of from about 1 micrometer to about 100 micrometers; and
forming one or more layers of graphene on a surface of the electroplated layer, wherein
upon the formation of the one or more layers of graphene, π-orbitals of the graphene are hybridized with d-electrons of the nickel of the pure nickel or the nickel alloy thus forming a nickel-graphene composite interface.

8. The method of claim 7, wherein the one or more layers of graphene is formed according to a process comprising chemical vapor deposition (CVD), thin film physical vapor deposition (PVD), or deposition of hydrogenated amorphous carbon.

9. The method of claim 7, wherein three or more layers of graphene are formed.

10. The method of claim 7, wherein the electroplated layer is formed on a coolant side, a condensing side, or both sides of the condensing element.

11. The method of claim 7, wherein the one or more layers of graphene is formed according to a process comprising chemical vapor deposition (CVD).

12. The method of claim 7, wherein the condensing element comprises a tube.

* * * * *